United States Patent
Kobayashi et al.

(12) United States Patent (10) Patent No.: US 10,999,677 B2
(45) Date of Patent: May 4, 2021

(54) SOUND REPRODUCING APPARATUS HAVING MULTIPLE DIRECTIONAL SPEAKERS AND SOUND REPRODUCING METHOD

(71) Applicant: ASAHI KASEI KABUSHIKI KAISHA, Tokyo (JP)

(72) Inventors: Shiro Kobayashi, Menlo Park, CA (US); Masaya Yamashita, Tokyo (JP); Takeshi Ishii, Tokyo (JP); Soichi Mejima, New York, NY (US)

(73) Assignee: ASAHI KASEI KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 16/424,855

(22) Filed: May 29, 2019

(65) Prior Publication Data

US 2020/0382869 A1    Dec. 3, 2020

(51) Int. Cl.
*H04R 3/12* (2006.01)
*H04R 1/40* (2006.01)
(Continued)

(52) U.S. Cl.
CPC .............. *H04R 3/12* (2013.01); *H04R 1/403* (2013.01); *H04R 29/002* (2013.01);
(Continued)

(58) Field of Classification Search
CPC ...... G06K 9/00362; H04R 3/12; H04R 1/403; H04R 29/002; H04R 2203/00;
(Continued)

(56) References Cited

U.S. PATENT DOCUMENTS

| 5,666,426 A * | 9/1997 | Helms ................. H03G 3/32 |
| | | 381/104 |
| 9,392,389 B2 | 7/2016 | Hall et al. |

(Continued)

FOREIGN PATENT DOCUMENTS

| JP | H05150792 A | 6/1993 |
| JP | 2009111833 A | 5/2009 |

(Continued)

OTHER PUBLICATIONS

Aug. 11, 2020, International Search Report issued in the International Patent Application No. PCT/JP2020/021413.

*Primary Examiner* — Xu Mei
(74) *Attorney, Agent, or Firm* — Kenja IP Law PC (57) ABSTRACT

A sound reproducing apparatus and a sound reproducing method are provided. The apparatus includes multiple directional speakers located at different places, an information acquisition unit configured to acquire sensing information of a person to be provided with a reproduced sound, and a processor that determines a position of the person from the acquired sensing information and controls output levels of the multiple directional speakers. The method includes the steps of acquiring sensing information of a person to be provided with a reproduced sound, determining a position of the person from the acquired sensing information, and controlling output levels of the directional speakers. The output levels of the speakers are determined based on the distance from the person.

19 Claims, 5 Drawing Sheets

(51) Int. Cl.
  *H04R 29/00* (2006.01)
  *H04N 5/247* (2006.01)
  *G06K 9/00* (2006.01)
  *H03G 3/30* (2006.01)

(52) U.S. Cl.
  CPC ....... *G06K 9/00362* (2013.01); *H03G 3/3005* (2013.01); *H03G 3/3089* (2013.01); *H04N 5/247* (2013.01); *H04R 2430/01* (2013.01)

(58) Field of Classification Search
  CPC ............ H04R 2203/12; H04R 2430/01; H04R 2430/20; H03G 3/00; H03G 3/001; H03G 3/32; H03G 3/3005; H03G 3/3009; H03G 1/1088; H03G 7/007
  USPC .......................................... 381/104, 107, 109
  See application file for complete search history.

(56) References Cited

U.S. PATENT DOCUMENTS

| | | | | |
|---|---|---|---|---|
| 9,591,399 | B1* | 3/2017 | Wu | G06K 9/00228 |
| 9,602,916 | B2 | 3/2017 | Asada | |
| 10,111,002 | B1* | 10/2018 | Poulad | H04H 60/04 |
| 10,148,241 | B1* | 12/2018 | Peeler | H03G 3/3005 |
| 2007/0011196 | A1* | 1/2007 | Ball | H04N 21/4852 |
| 2012/0020487 | A1* | 1/2012 | Fried | H04M 1/72533 381/58 |
| 2013/0058503 | A1 | 3/2013 | Kato et al. | |
| 2013/0077803 | A1 | 3/2013 | Konno et al. | |
| 2013/0202132 | A1* | 8/2013 | Zurek | H04M 1/605 381/107 |
| 2013/0279706 | A1* | 10/2013 | Marti | G06F 3/165 381/57 |
| 2015/0010169 | A1* | 1/2015 | Popova | H03G 3/20 381/107 |
| 2015/0346845 | A1 | 12/2015 | Di Censo et al. | |
| 2017/0188171 | A1* | 6/2017 | Ishida | G01S 7/54 |

FOREIGN PATENT DOCUMENTS

| | | |
|---|---|---|
| JP | 2013057705 A | 3/2013 |
| JP | 2013251751 A | 12/2013 |
| JP | 2017147512 A | 8/2017 |
| JP | 2017161448 A | 9/2017 |
| JP | 2017191967 A | 10/2017 |
| JP | 2018107678 A | 7/2018 |
| JP | 2018148254 A | 9/2018 |
| JP | 2018171696 A | 11/2018 |
| WO | 2018016432 A1 | 1/2018 |
| WO | 2018088450 A1 | 5/2018 |

* cited by examiner

FIG.5

SOUND REPRODUCING APPARATUS HAVING MULTIPLE DIRECTIONAL SPEAKERS AND SOUND REPRODUCING METHOD

TECHNICAL FIELD

The present disclosure relates to a sound reproducing apparatus having multiple directional speakers and a sound reproducing method.

BACKGROUND

Directional audio systems, also known as parametric acoustic arrays, have been used in many practical audio applications. The directional audio systems often use ultrasound waves to transmit audio in a directed beam of sound. Ultrasound waves have much smaller wavelengths than regular audible sound and thus the directional audio systems become much more directional than traditional loudspeaker systems. For example, U.S. Pat. No. 9,392,389 discloses a system for providing an audio notification containing personal information to a specific person via a directional speaker.

These conventional directional audio systems have been used in exhibitions, galleries, museums, and the like to provide audio information that is audible only to a specific person in a limited area

SUMMARY

Retailers such as department stores, drug stores, and supermarkets often arrange similar products on long shelves separated by aisles. Sales of the similar products depend greatly on the ability of the product to catch the shopper's eye and on product placement.

However, due to limitations of conventional product packaging, there has been demands for more effective ways to draw the shopper's attention to a specific product associated with the shopper's interest. In some stores, a small speaker is installed around the shelf to attract the shopper's attention to a specific product. The sound from the speaker, however, can be heard within a limited space and thus is not always an effective advertisement media in a large space.

It is, therefore, an object of the present disclosure to provide a sound reproducing apparatus and a sound reproducing method which can effectively provide a person with an audible sound in a large space.

In order to achieve the object, one aspect of the present disclosure is a sound reproducing apparatus, comprising:
multiple directional speakers located at different places;
an information acquisition unit configured to acquire sensing information of a person to be provided with a reproduced sound; and
a processor that determines a position of the person from the acquired sensing information and controls output levels of the multiple directional speakers.

Another aspect of the present disclosure is a method for reproducing a sound from multiple directional speakers, comprising:
acquiring sensing information of a person to be provided with a reproduced sound;
determining a position of the person from the acquired sensing information; and
controlling output levels of the directional speakers.

According to the sound reproducing apparatus and the sound reproducing method of the present disclosure, it is possible to effectively draw a person's attention to a specific target object in a large space

BRIEF DESCRIPTION OF THE DRAWINGS

Various other objects, features and attendant advantages of the present invention will become fully appreciated as the same becomes better understood when considered in conjunction with the accompanying drawings, in which like reference characters designate the same or similar parts throughout the several views, and wherein.

DETAILED DESCRIPTION

Figure 1:
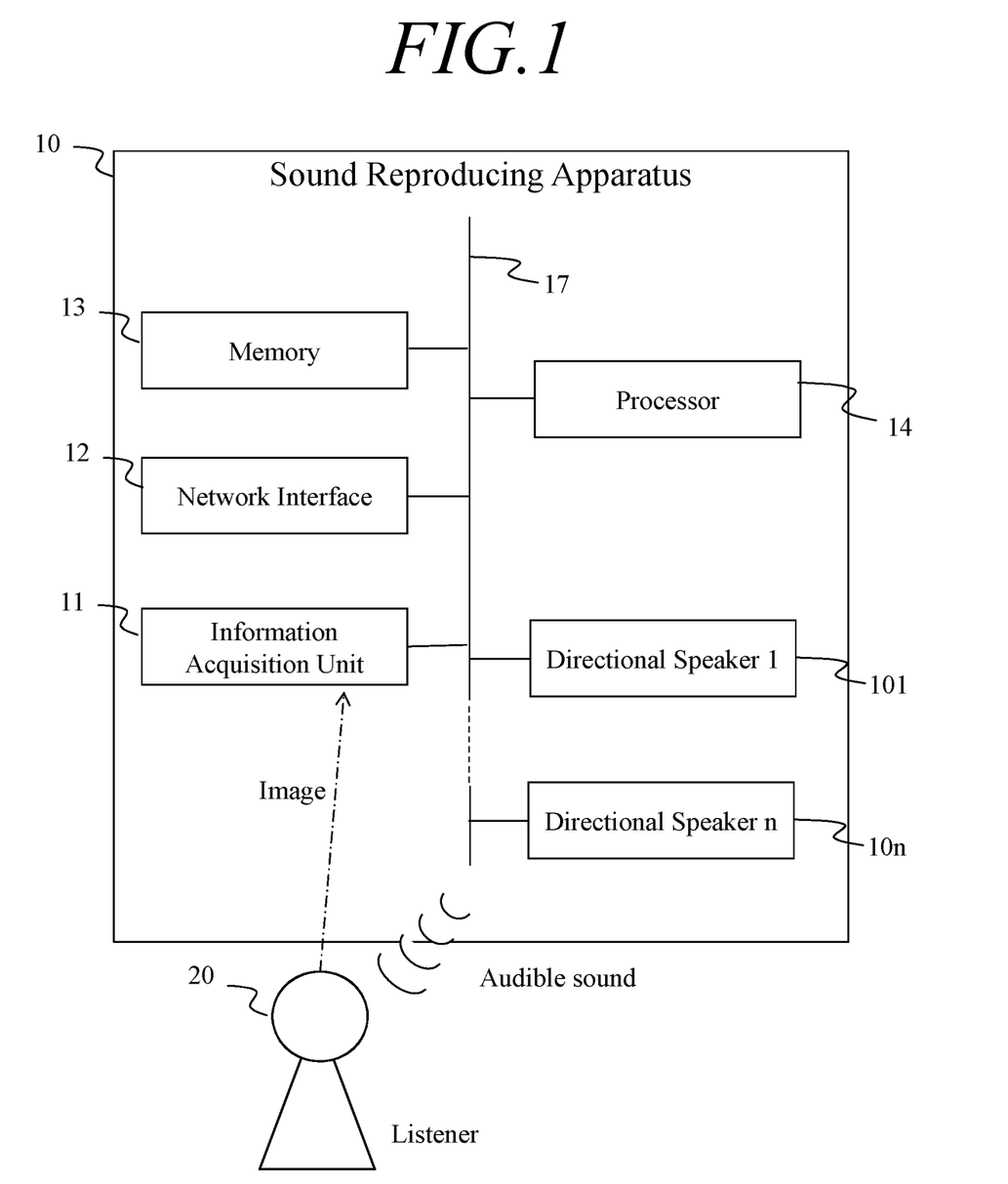
FIG. 1 is a schematic diagram of a sound reproducing apparatus according to an embodiment of the present disclosure.

Embodiments will now be described with reference to the drawings. FIG. 1 is a block diagram of a sound reproducing apparatus 10 according to an embodiment of the present disclosure.

The sound reproducing apparatus 10 includes an information acquisition unit 11, a processor 14, and n pieces of directional speakers 101, . . . , 10n which are electrically connected with each other via a bus 106. In this embodiment, the sound reproducing apparatus 10 further include a network interface 12, and a memory 13, which are not essential for the present disclosure.

The directional speakers 101, . . . , 10n are located at different places in a site such as a department store, a drug store, and a supermarket, where the sound reproducing apparatus 10 is installed and used.

The information acquisition unit 11 acquires sensing information of a person to be provided with a reproduced sound (hereinafter also referred to as a "listener"). The information acquisition unit 11 is provided with one or more human-detection sensors capable of detecting the presence of the listener including, but not limited to, infrared sensors and motion sensors. Alternatively, the information acquisition unit 11 may include one or more image sensors such as CCD cameras to acquire an image or images of the listener. When two or more image sensors are used, each of the image sensor is preferably located to cover a blind angle of another image sensor so that at least one image sensor can capture an image of the listener. The information acquisition unit 11 transmits the acquired sensing information to the processor 14. The acquired sensing information may include a signal from the human-detection sensor detecting the presence of the listener or the image(s) of the listener captured by the image sensor.

The network interface 12 includes a communication module that connects the sound reproducing apparatus 10 to a network. The network is not limited to a particular communication network and may include any communication network including, for example, a mobile communication network and the internet. The network interface 12 may include a communication module compatible with mobile communication standards such as 4th Generation (4G) and 5th Generation (5G). The communication network may be an ad hoc network, a local area network (LAN), a metropolitan area network (MAN), a wireless personal area network (WPAN), a public switched telephone network (PSTN), a terrestrial wireless network, an optical network, or any combination thereof.

The memory 13 includes, for example, a semiconductor memory, a magnetic memory, or an optical memory. The memory 13 is not particularly limited to these, and may include any of long-term storage, short-term storage, volatile, non-volatile and other memories. Further, the number of memory modules serving as the memory 13 and the type of medium on which information is stored are not limited. The memory may function as, for example, a main storage device, a supplemental storage device, or a cache memory. The memory 13 also stores any information used for the operation of the sound reproducing apparatus 10. For example, the memory 13 may store a system program and an application program. The information stored in the memory 13 may be updatable by, for example, information acquired from an external device by the network interface 12.

The memory 13 also stores a floor map of the site on which positions of the directional speakers 101, . . . , 10n and the one or more sensors of the information acquisition unit 11 are indicated by XY coordinates.

The processor 14 may be, but not limited to, a general-purpose processor or a dedicated processor specialized for a specific process. The processor 14 includes a microprocessor, a central processing unit (CPU), an application specific integrated circuit (ASIC), a digital signal processor (DSP), a programmable logic device (PLD), a field programmable gate array (FPGA), a controller, a microcontroller, and any combination thereof. The processor 14 controls the overall operation of the sound reproducing apparatus 10.

For example, the processor 14 determines a position of the listener. Specifically, the processor 14 calculates the position of the listener from the positions of the sensors that detect the presence of the listener. Alternatively, the processor 14 analyses the image(s) transmitted from the information acquisition unit 11, for example, by the following procedure.

The processor 14 detects a face or a head of the listener in the image captured by a sensor, in this case, a camera. Then, the processor 14 measures the size of the face/head in the image, and calculates the distance between the camera and the listener based on the measured size of the face/head and the assumption that the size of the face/head is in inversely proportional to the distance between the camera and the listener. Since the position and the orientation of the camera are known, the processor 14 can determine the position of the listener on the floor map from the distance and the location of the listener in the image.

Based on the position of the listener, the processor 14 then calculates distances from the directional speakers 101, . . . , 10n, and adjusts output levels of the speakers 101, . . . , 10n based on the distances from the listener.

Optionally, the processor 14 may determine attribute information of the listener extracted from the image information. The attribute information is any information representing the attributes of the listener, and includes gender, age group, height, body type, hairstyle, clothes, emotion, belongings, head orientation, gaze direction, and the like of the listener. The processor 14 may perform an image recognition processing on the image information to extract at least one type of the attribute information of the listener. As the image recognition processing, various image recognition methods that have been proposed in the art may be used. For example, the processor 14 may analyze the image by an image recognition method based on machine learning such as a neural network or deep learning. Data used in the image recognition processing may be stored in the memory 13. Alternatively, data used in the image recognition processing may be stored in a storage of an external device (hereinafter referred simply as the "external device") accessible via the network interface 12 of the sound reproducing apparatus 10.

The image recognition processing may be performed on the external device. Also, the determination of the target object may be performed on the external device. In these cases, the processor 14 transmits the image information to the external device via the network interface 12. The external device extracts the attribute information from the image information and determines the target object based on plurality types of the attribute information. Then, the attribute information and the information of the target object are transmitted from the external device to the processor 14 via the network interface 12.

Figure 2:
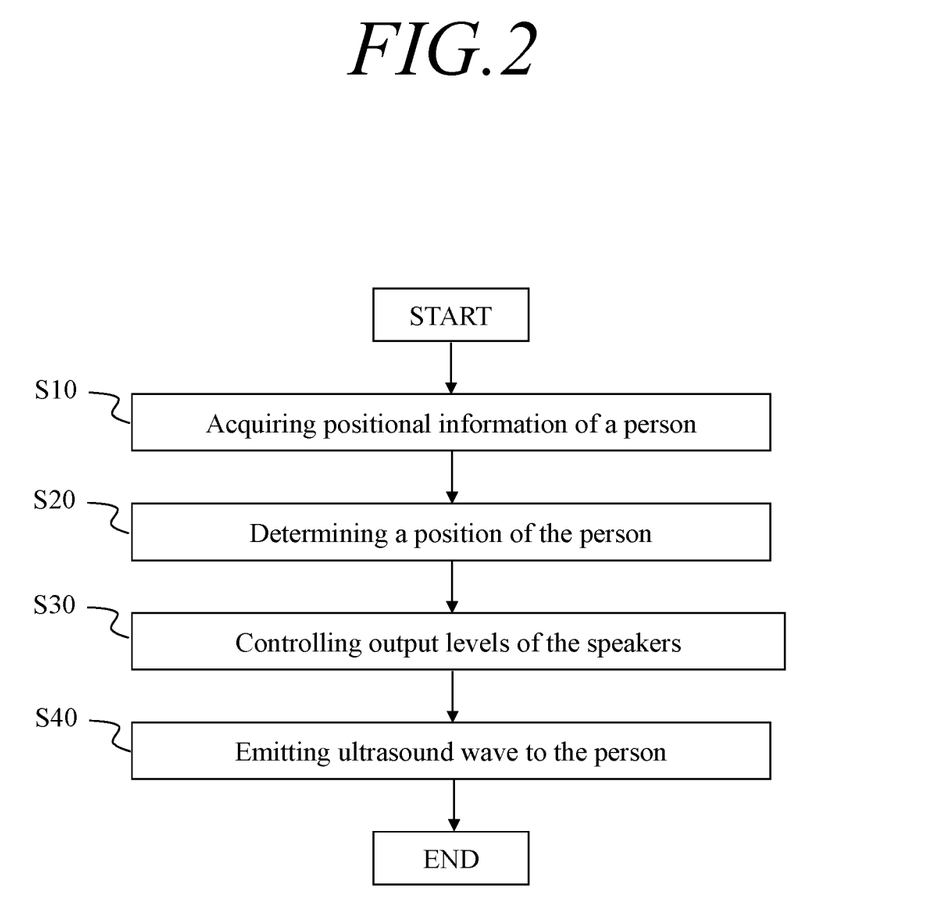
FIG. 2 is a flowchart showing steps in an operation of the sound reproducing apparatus according to an embodiment of the present disclosure.

Referring now to FIG. 2, the operation of the sound reproducing apparatus 10 will be discussed.

At the step S10, the information acquisition unit 11 acquires sensing information of a listener to be provided with a reproduced sound and transmits the acquired sensing information to the processor 14.

The processor 14 determines, at step S20, the position of the listener based on the sensing information received from the information acquisition unit 11.

Then, the processor 14 control output levels of the directional speakers based on the position of the listener at step S30. For example, the processor calculates distances between the listener and the directional speakers and sets the output levels of the directional speakers in inversely proportional to the distances from the listener.

At step S40, the processor 14 drive the speakers at the respective output levels set at step S30.

Since the sound is reproduced from only the directional speaker closest to the listener, repeating sound from multiple directional speakers can be avoided and thus the listener can hear clear sounds reproduced from a single speaker.

Moreover, even when the listener is moving around, the sounds are effectively delivered to the listener.

Figure 3:
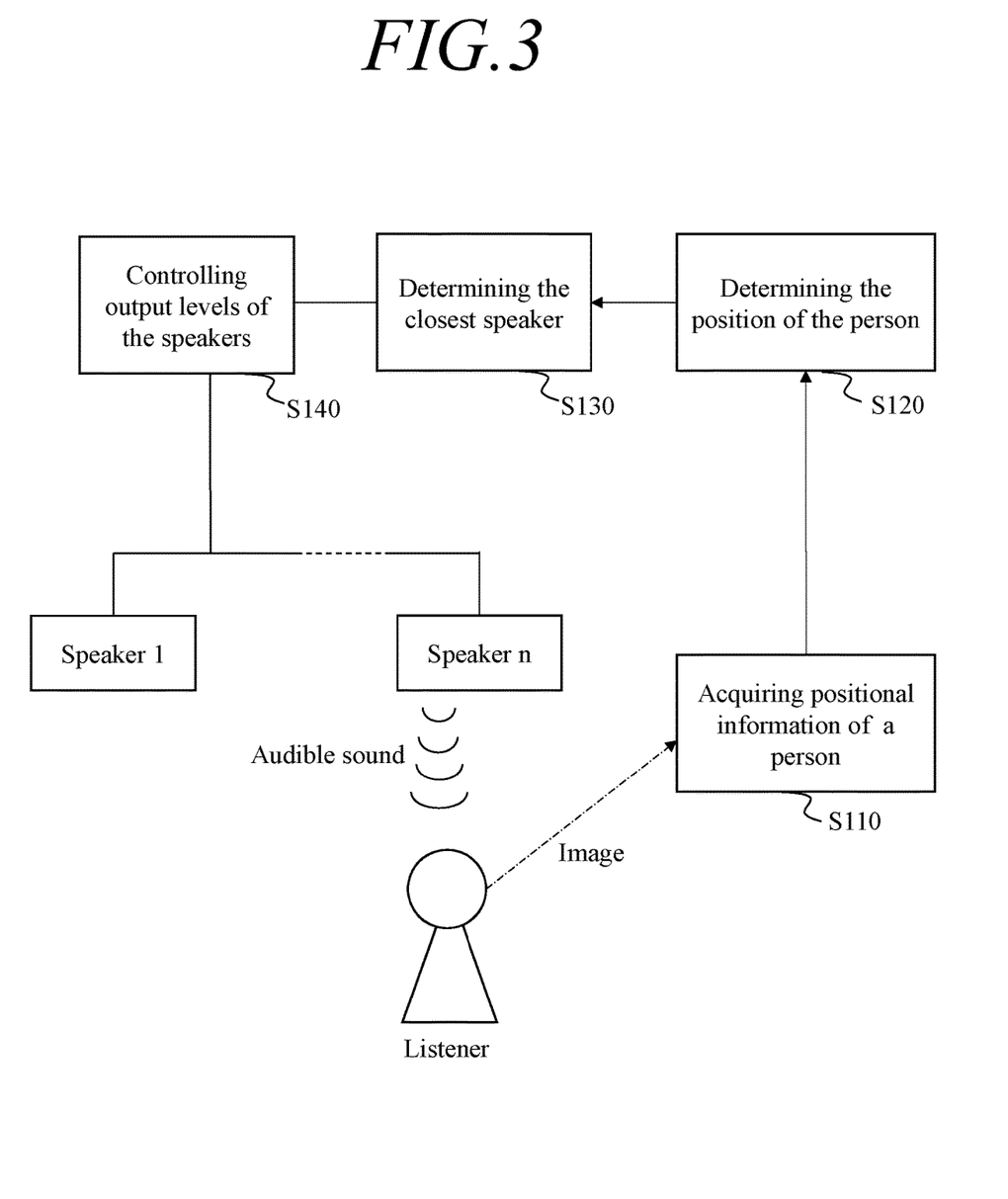
FIG. 3 is a diagram showing a general flow of an operation of the sound reproducing apparatus according to another embodiment of the present disclosure.

FIG. 3 is a diagram showing a general flow of an operation of another embodiment of the present disclosure. In this embodiment, the information acquisition unit 11 has at least one camera such as a 2D camera, a 3D camera, and an infrared camera, and captures an image of the listener at a predetermined screen resolution and a predetermined frame rate. The captured image is transmitted to the processor 14 via the bus 16. The predetermined screen resolution is, for example, full high-definition (FHD; 1920*1080 pixels), but may be another resolution as long as the captured image is appropriate to the subsequent image recognition processing. The predetermined frame rate may be, but not limited to, 30 fps. The emitter 15 is a directional speaker projecting a narrow beam of modulated ultrasound waves.

At step S110, the camera 11 captures an image of a listener as the image information and sends it to the processor 14.

The processor 14 extracts the sensing information of the listener from the image information at step S120. The processor 14 may perform an image recognition processing on the image information to identify the position of the listener and locate the position on the floor map stored in the memory 13. Two or more images from different cameras may be used to more accurately identify the position of the listener. The processor 14 may also extract one or more types of attribute information of the listener including, but not limited to, an age group (e.g., 40s) and a gender (e.g., female).

At step S130, the processor 14 determines the directional speaker which is closest to the listener based on the floor map. For example, the processor 14 calculates distances between the listener and the directional speakers and decides the directional speaker having the smallest distance.

Then, the processor 14 controls outputs levels of the directional speakers at step S140. Specifically, the processor 14 sets the output level of the directional speaker closest to the listener to 100% and sets the output levels of the remaining directional speakers to 0%. The processor 14 drives each speaker at the respective output level to reproduce predetermined audible sound. In this embodiment, only the closest speaker reproduces the predetermined audible sound, and the rest of the directional speakers are muted.

The predetermined audible sound may be any type of sounds such as music, weather forecasts, and live streaming of radio programs, and may be determined based on the extracted one or more types of the attribute information of the listener. For example, the processor 14 searches a product often bought by people belonging to the extracted attributes from database stored in the memory 13 or from the network via the network interface 12. For example, when the extracted attributes are "female" and "age in 40s" and a food wrap is most often bought by people belonging to female in 40s, the processor 14 further retrieves audio data associated with the food wrap from the memory 13 or from the network via the network interface 12. The predetermined audible sound may be a human voice explaining the detail of the product or a song used in a TV commercial of the product.

The processor 14 may communicate with the external device via the network interface 12 to get supplemental information. The supplemental information may be any information useful to determine the target object, such as weather condition, season, temperature, humidity, current time, product sale information, product price information, product inventory information, news information, and the like. The supplemental information may be used to determine the sound to be reproduced.

In an alternative embodiment, the information acquisition unit 11 may be a plurality of human-detection sensors and each of the human-detection sensor is associated with a distinctive directional speaker. When the presence of the listener is detected by one of the human-detection sensors, the processor 14 sets the output level of the directional speaker associated with the human-detection sensor detecting the presence of the listener to 100% and the output levels of the remaining directional speakers to 0%.

In another embodiment, the information acquisition unit 11 may be a plurality of human-detection sensors and positions of the human-detection sensors indicated by XY coordinates are stored in the memory 13. When the presence of the listener is detected by one of the human-detection sensors, the processor 14 determines the directional speaker which is closest to the listener based on the floor map and control the output levels of the directional speakers in the same manner as discussed above.

Figure 4:
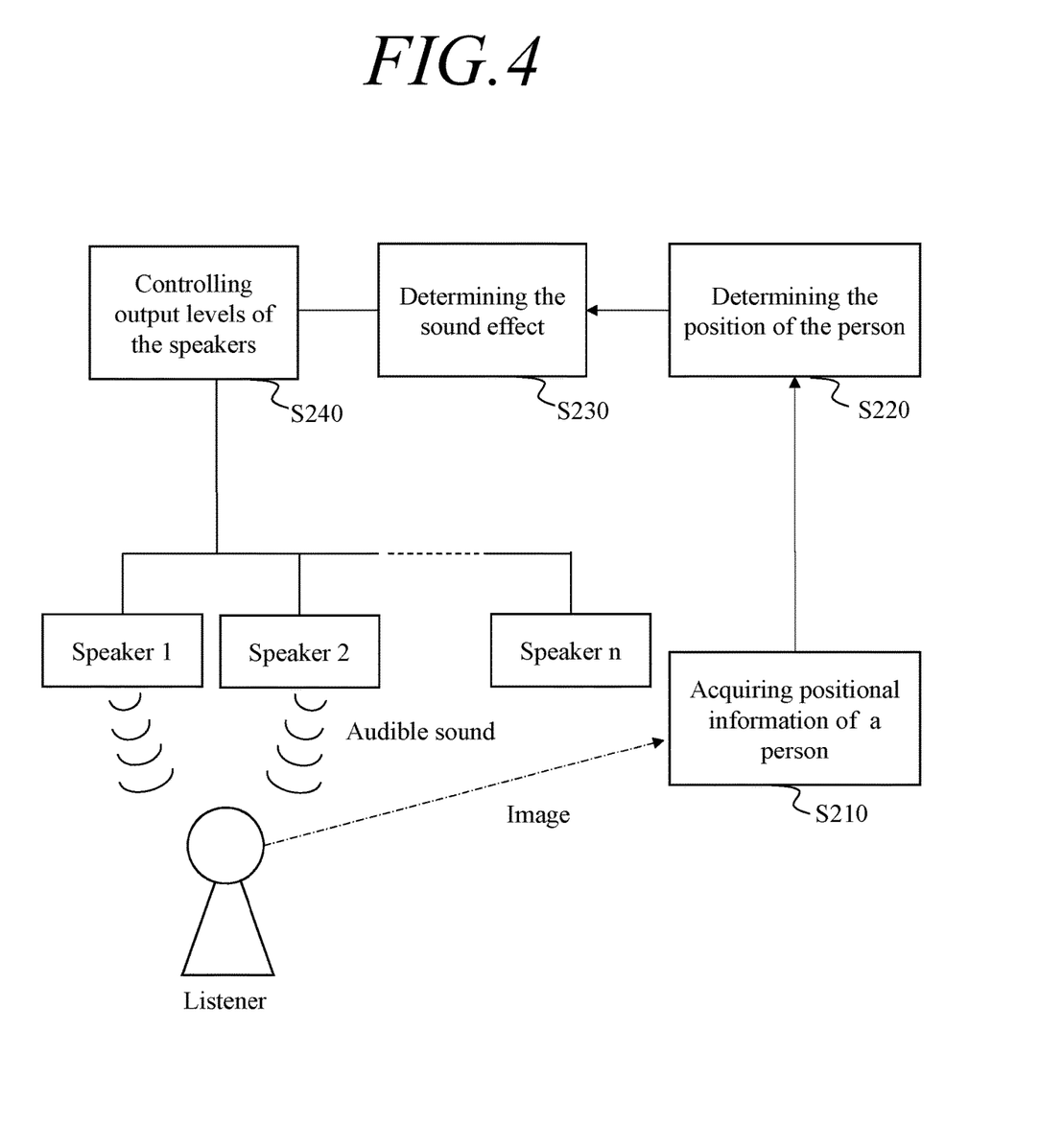
FIG. 4 is a diagram showing a general flow of an operation of the sound reproducing apparatus according to another embodiment of the present disclosure.

FIG. 4 is a diagram showing a general flow of an operation of another embodiment of the present disclosure. This embodiment is similar to the embodiment shown in FIG. 3 except that the output levels of the speakers are determined based on not only the distance from the listener but also a sound effect desired to be added to the audible sound. For example, a stereo sound is used as a source of the predetermined audible sound, the processor 14 determines a stereo effect to be added to the audible sound at step S230. The processor 14 also selects two directional speakers which are closest to the listener on different sides of the listener. In FIG. 4, the processor 14 selects the speaker 1 which is the closest speaker on the right side of the listener and the speaker 2 which is the closest speaker on the left side of the listener.

Then, the processor 14 controls outputs levels of the directional speakers at step S240. Specifically, the processor 14 sets the output level of the directional speakers 1 and 2 to 100% and sets the output levels of the remaining directional speakers to 0%. The processor 14 also send the right channel data of the stereo sound to the speaker 1 and the left channel date of the stereo sound to the speaker 2.

Multi-channel audio data may also be used. In this case, the processor 14 selects speakers of the same number as the channels of the audio data and controls each speaker to produce a distinctive channel of the audio data.

Figure 5:
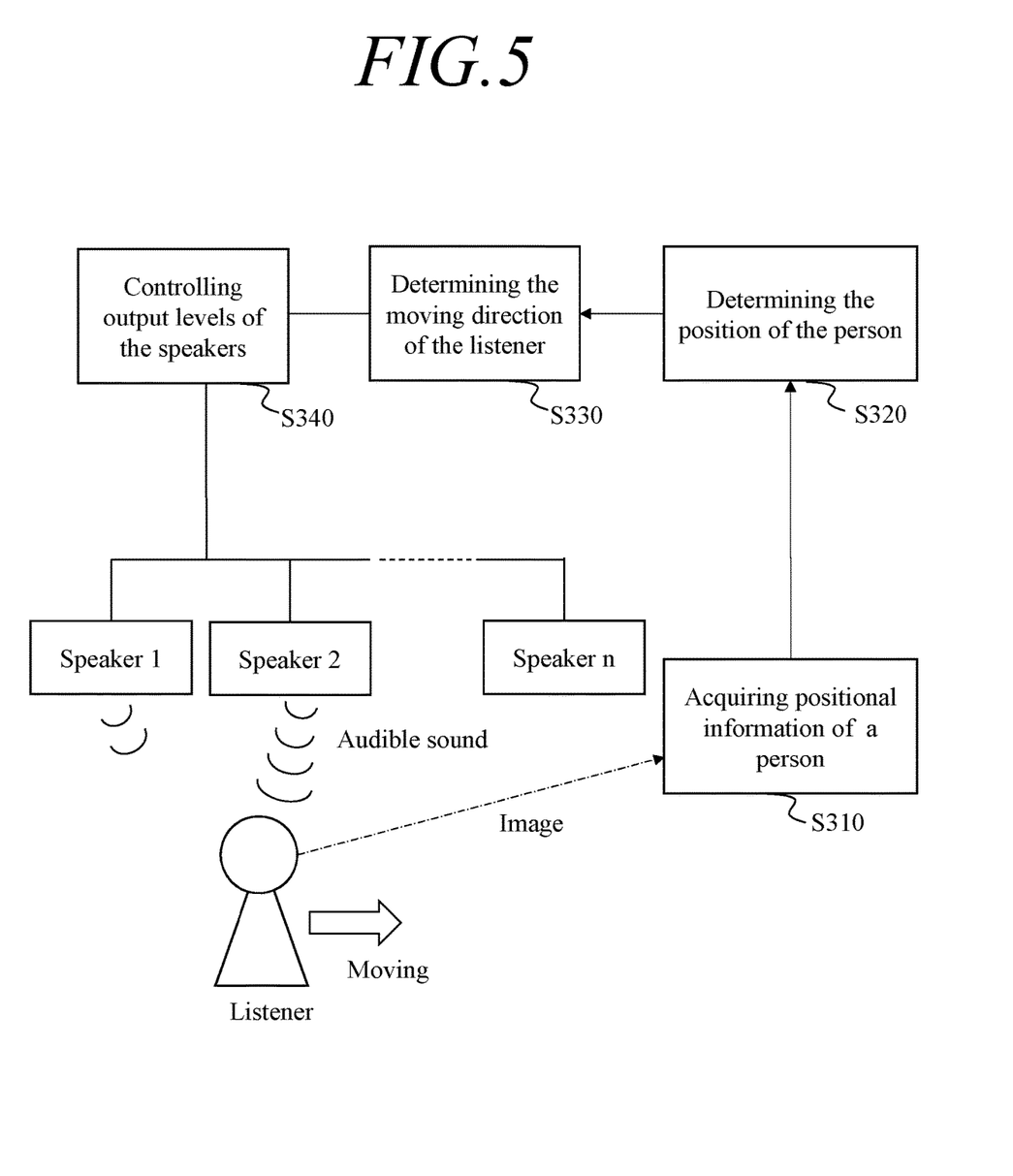
FIG. 5 is a diagram showing a general flow of an operation of the sound reproducing apparatus according to yet another embodiment of the present disclosure.

FIG. 5 is a diagram showing a general flow of an operation of yet another embodiment of the present disclosure. This embodiment is similar to the embodiment shown in FIG. 3 except that the output levels of the speakers are determined based on not only the distance from the listener but also a movement of the listener.

At step S330, the processor 14 analyses the plural images of the listener captured by the information acquisition unit 11 for a certain time period. For example, images captured in the past three seconds are used to determine which direction the listener is moving to. Based on the current position of the listener and the moving direction of the listener, the processor 14 sets the output levels of the directional speaker closest to the listener and the directional speaker second closest to the listener in the moving direction to 100% and sets the output levels of the remaining directional speakers to 0%. The processor 14 drives each speaker at the respective output level to reproduce predetermined audible sound. In this embodiment, only the closest and the second closest speakers reproduce the predetermined audible sound, and the rest of the directional speakers are muted. This enables to handover from one speaker to another speaker seamlessly.

The matter set forth in the foregoing description and accompanying drawings is offered by way of illustration only and not as a limitation. While particular embodiments have been shown and described, it will be apparent to those skilled in the art that changes and modifications may be made without departing from the broader aspects of applicant's contribution.

For example, the handover from speaker to speaker may be performed by controlling the output levels of the speakers depending on the distance from the listener. More specifically, the output levels may be in inversely proportional to the distances from the listener. That is, the closer the speakers are to the listener, the louder the sounds reproduced from the speaker are. Alternatively, the processor 14 sets the output levels of the speakers which are within a predetermined distance from the listener to a certain value (e.g. 80%) and sets the output levels to the remaining speakers to 0%. That is, all of the speakers within the predetermined distance from the listener reproduce the sound. The processor 14 controls the output levels of the speakers in a real time manner while the listener is moving.

Moreover, the above-discussed embodiments may be stored in computer readable non-transitory storage medium as a series of operations or a program related to the operations that is executed by a computer system or other hardware capable of executing the program. The computer system as used herein includes a general-purpose computer, a personal computer, a dedicated computer, a workstation, a PCS (Personal Communications System), a mobile (cellular) telephone, a smart phone, an RFID receiver, a laptop computer, a tablet computer and any other programmable data processing device. In addition, the operations may be performed by a dedicated circuit implementing the program codes, a logic block or a program module executed by one or more processors, or the like. Further, the sound reproducing apparatus 10 including the network interface 12 has been described. However, the network interface 12 can be removed and the sound reproducing apparatus 10 may be configured as a standalone apparatus.

The actual scope of the protection sought is intended to be defined in the following claims when viewed in their proper perspective based on the prior art.

The invention claimed is:

1. A sound reproducing apparatus, comprising:
   multiple directional speakers located at different places;
   an information acquisition unit configured to acquire sensing information of a person to be provided with a reproduced sound;
   a processor that determines a position of the person from the acquired sensing information; and
   a memory storing a floor map where the sound reproducing apparatus is installed,
   wherein the processor locates the position of the person on the floor map stored in the memory to determine which of the multiple directional speakers is closest to the person, and control an output level of the closest directional speaker,
   the information acquisition unit includes one or more image sensors, and
   the processor extracts attribute information of the person from the image and determines a sound to be reproduced from the directional speakers based on the extracted attribute information.

2. The sound reproducing apparatus according to claim 1, wherein the information acquisition unit includes one or more human-detection sensors.

3. The sound reproducing apparatus according to claim 2, wherein the information acquisition unit includes multiple human-detection sensors,
   the number of the directional speakers is the same as the number of the human-detection sensors, and
   each of the directional speakers is associated with respective one of the human-detection sensors.

4. The sound reproducing apparatus according to claim 1, wherein the information acquisition unit includes two or more image sensors, and
   each of the image sensor is located to cover a blind angle of another image sensor.

5. The sound reproducing apparatus according to claim 1, further comprising a communication module configured to be connected to a network.

6. The sound reproducing apparatus according to claim 1, wherein the processor calculates distances between the directional speakers and the person and controls each of the output levels of the multiple directional speakers based on the respective distance from the person.

7. The sound reproducing apparatus according to claim 1, wherein the processor determines a moving direction of the person from the acquired sensing information and determines which of the multiple directional speakers is second closest to the person in the moving direction, and only the closest and second closest speakers reproduce the sound.

8. The sound reproducing apparatus according to claim 1, wherein the processor communicate with an external device to get supplemental information, and determines the sound to be reproduced from the directional speakers based on the extracted attribute information and the supplemental information.

9. The sound reproducing apparatus according to claim 1, wherein the processor communicate with an external device to get supplemental information, and determines the sound to be reproduced from the directional speakers based on the extracted attribute information, the position of the person on the floor map and the supplemental information.

10. A method for reproducing a sound from multiple directional speakers, comprising:
    acquiring sensing information of a person to be provided with a reproduced sound, the acquired sensing information including an image of the person captured by an image sensor;
    determining a position of the person from the acquired sensing information;
    locating the position of the person on a floor map stored in a memory;
    determining which of the multiple directional speakers is closest to the person;
    controlling an output level of the closest directional speaker; and
    extracting attribute information of the person from the image and determining a sound to be reproduced from the directional speakers based on the extracted attribute information.

11. The method according to claim 10, wherein the acquired sensing information includes a signal from a human-detection sensor detecting the presence of the person.

12. The method according to claim 11, wherein the sound is reproduced from one of the directional speakers associated with the human-detection sensor detecting the present of the person.

13. The method according to claim 10, wherein the sound is reproduced from one of the directional speakers closest to the person and the remaining speakers are muted.

14. The method according to claim 10, further comprising:
    calculating distances between the directional speakers and the person, and wherein
    the output levels of the directional speakers are controlled in inversely proportional to the respective distances from the person.

15. The method according to claim 10, further comprising:
    calculating distances between the directional speakers and the person,
    and wherein
    the output levels of the directional speakers are determined based on the distances from the person and a sound effect desired to be added to the reproducing sound.

16. The method according to claim 10, further comprising:
    calculating distances between the directional speakers and the person, and
    analyzing the sensing information to determine a direction to which the person is moving, and wherein the output levels of the speakers are determined based on the distance from the person and the direction to which the person is moving.

17. The method according to claim 10, further comprising:
   determining a moving direction of the person from the acquired sensing information and determining which of the multiple directional speakers is second closest to the person in the moving direction,
   wherein only the closest and second closest speakers reproduce the sound.

18. The method according to claim 10, further comprising:
   communicating with an external device to get supplemental information; and
   determining the sound to be reproduced from the directional speakers based on the extracted attribute information and the supplemental information.

19. The method according to claim 10, further comprising:
   communicating with an external device to get supplemental information; and
   determining the sound to be reproduced from the directional speakers based on the extracted attribute information, the position of the person on the floor map and the supplemental information.

* * * * *